(12) United States Patent
Okita

(10) Patent No.: US 9,609,718 B1
(45) Date of Patent: Mar. 28, 2017

(54) IN-VEHICLE EQUIPMENT

(71) Applicant: Mitsubishi Electric Corporation, Tokyo (JP)

(72) Inventor: Shuichi Okita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/122,896

(22) PCT Filed: Mar. 28, 2014

(86) PCT No.: PCT/JP2014/059166
§ 371 (c)(1),
(2) Date: Aug. 31, 2016

(87) PCT Pub. No.: WO2015/145733
PCT Pub. Date: Oct. 1, 2015

(51) Int. Cl.
*H05B 33/08* (2006.01)
*H02M 3/156* (2006.01)
*H02M 1/08* (2006.01)
*H02J 7/00* (2006.01)
*B60R 16/033* (2006.01)
*H02M 1/32* (2007.01)

(52) U.S. Cl.
CPC ......... *H05B 33/089* (2013.01); *B60R 16/033* (2013.01); *H02J 7/0029* (2013.01); *H02J 7/0065* (2013.01); *H02M 1/08* (2013.01); *H02M 1/32* (2013.01); *H02M 3/156* (2013.01); *H02J 2007/0067* (2013.01)

(58) Field of Classification Search
CPC ...... H02J 7/02; H02J 3/32; H02J 1/108; H02J 7/0034

USPC ............... 320/165, 134, DIG. 20, FOR. 124, 320/FOR. 125
See application file for complete search history.

(56) References Cited

U.S. PATENT DOCUMENTS

| | | | |
|---|---|---|---|
| 6,548,916 B1 | 4/2003 | Kanazawa et al. | |
| 2005/0156574 A1 | 7/2005 | Sato et al. | |
| 2009/0243546 A1* | 10/2009 | Sakurai | H02J 7/0034 320/134 |
| 2010/0215994 A1* | 8/2010 | Kim | H01M 10/46 429/7 |
| 2014/0184107 A1 | 7/2014 | Maekawa et al. | |

FOREIGN PATENT DOCUMENTS

| | | |
|---|---|---|
| JP | 2000-261301 A | 9/2000 |
| JP | 2004-135478 A | 4/2004 |
| JP | 2005-130664 A | 5/2005 |
| JP | 2007-82374 A | 3/2007 |
| JP | 2013-59167 A | 3/2013 |

* cited by examiner

*Primary Examiner* — Tuyet Vo
(74) *Attorney, Agent, or Firm* — Birch, Stewart, Kolasch & Birch, LLP

(57) ABSTRACT

A FET of a power supply reverse connection protection section is connected between a battery and an electronic device, and at a time of reverse connection of the battery, the FET is turned off and a parasitic diode of the FET prevents a current flowing in a direction opposite to a direction at a time of normal connection. A transformer is used in a DC/DC converter of a first power supply section that supplies power to a control section, and a voltage generated in a secondary winding is applied to the FET.

6 Claims, 7 Drawing Sheets

IN-VEHICLE EQUIPMENT

TECHNICAL FIELD

The invention relates to in-vehicle equipment having a function of preventing, at reverse connection of a battery, a current from flowing in a direction opposite to that at normal connection thereof.

BACKGROUND ART

A power supply reverse connection protection function that prevents, in a case where a plus terminal and a minus terminal of an in-vehicle battery are connected reversely, a failure of in-vehicle equipment due to a current flow in a direction opposite to that in a normally connected case is proposed in, e.g., each of Patent Documents 1 and 2.

In a power supply reverse connection protection circuit according to Patent Document 1, on a power supply wiring that connects a power supply terminal connected to a plus terminal of a battery and a control circuit as a power supply target, an N-channel first FET (field-effect transistor) is provided such that an anode of a parasitic diode of the first FET is situated at the side of the power supply terminal, and an N-channel second FET is further provided on the downstream side of the first FET such that a cathode of a parasitic diode of the second FET is situated at the side of the first FET. During reverse connection of the battery, the first FET and the second FET are turned off, and a reverse current is inhibited by the parasitic diode of the first FET.

As a generation method of operation power for each gate of the first FET and the second FET in the conventional power supply reverse connection protection circuit, a method in which a charge pump-type booster circuit is provided in parallel with a feeder circuit that supplies power from the battery to the power supply target, and power from the booster circuit is applied to the gates has been mainly used (see, e.g., Patent Document 1).

Since the charge pump-type booster circuit requires many components such as a capacitor for boosting switching, a capacitor for smoothing, a plurality of switching elements for controlling charging and discharging of the capacitor for boosting switching, and a control circuit for switching between ON and OFF of the switching elements, the booster circuit becomes a factor responsible for an increase in size of a device and an increase in cost.

In order to avoid the increase in size of the device, an IC (Integrated Circuit) dedicated for the charge pump in which the above functions are integrated into one package or a high-function FET in which the charge pump-type booster circuit is included in the FET is developed. However, these devices serve as means for avoiding the increase in size of the device, but the increase in cost cannot be avoided.

In addition, Patent Document 2 discloses a power supply reverse connection protection circuit that uses two N-channel FETs, but the detail of a gate driver power generation circuit that generates the operation power for the FET is not described.

On the other hand, in Patent Document 3, a configuration in which multiple voltages are used and the charge pump circuit is not used is proposed. A power supply device according to Patent Document 3 includes a 12 V power supply and a 36 V power supply, and power supply from the 12 V power supply to a load is controlled by applying power from the 36 V power supply to the gate of an N-channel FET to thus turn on the FET. This method is presupposed to use multiple voltages of the power supply.

CITATION LIST

Patent Document

Patent Document 1: Japanese Patent Application Laid-open No. 2007-82374
Patent Document 2: Japanese Patent Application Laid-open No. 2013-59167
Patent Document 3: Japanese Patent Application Laid-open No. 2000-261301

SUMMARY OF THE INVENTION

Problems to be Solved by the Invention

As mentioned above, the conventional power supply reverse connection protection circuit needs to use the charge pump-type booster circuit, and thus there are problems of the increase in size of the device and the increase in cost.

The present invention has been made in order to solve the above-described problems, and an object thereof is to achieve reductions in size and cost of in-vehicle equipment.

Means for Solving the Problems

In-vehicle equipment according to the present invention includes: an electronic device that operates using an in-vehicle battery as a power supply; a first power supply that has a step-down DC/DC converter to reduce a voltage of the battery; a controller that operates using the first power supply as a power supply to control the electronic device; a power supply reverse connection protector that has a FET connected between the battery and the electronic device, wherein the FET is connected such that a forward direction of a parasitic diode of the FET matches a direction in which a current flows at a time of normal connection at which the battery and the electronic device are connected with a positive polarity, and that at a time of reverse connection at which the battery and the electronic device are connected with a reverse polarity, the FET is turned off and the parasitic diode prevents a current flowing in a direction opposite to that at the time of the normal connection; and a second power supply that generates a drive voltage to turn on the FET of the power supply reverse connection protector at the time of the normal connection by using a voltage generated in the step-down DC/DC converter of the first power supply.

Effect of the Invention

According to the present invention, since it is configured that the drive voltage to turn on the FET of the power supply reverse connection protector is generated by using the voltage generated in the step-down DC/DC converter, it is possible to achieve reductions in size and cost of the in-vehicle equipment as compared with a case where a charge pump-type booster circuit is used.

BEST MODE FOR CARRYING OUT THE INVENTION

Hereinbelow, in order to describe the present invention in greater detail, the best mode for carrying out the invention will be described according to the accompanying drawings.

Embodiment 1

Figure 1:
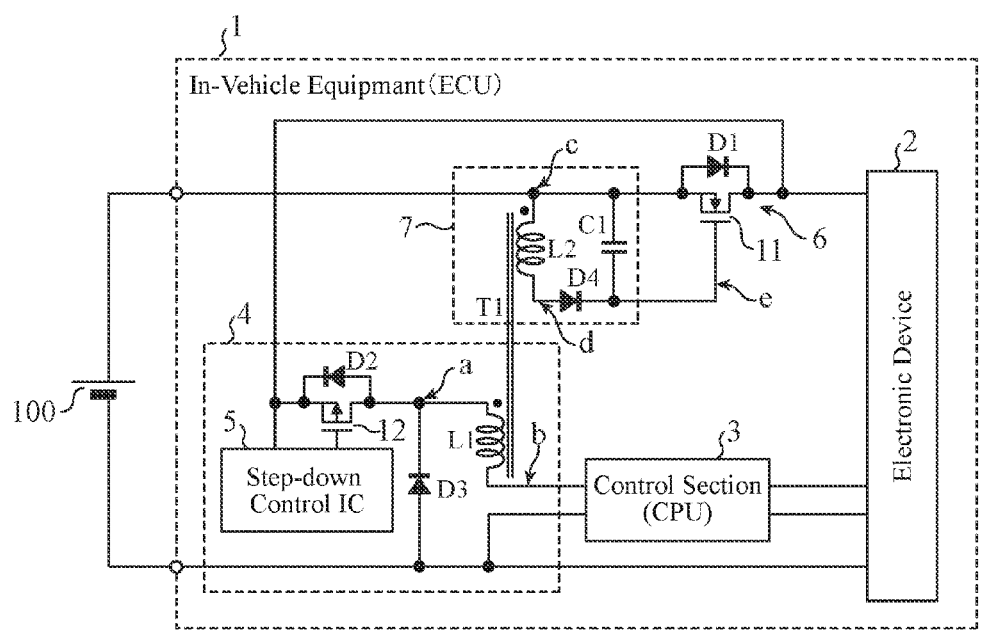
FIG. 1 is a circuit diagram showing a configuration of in-vehicle equipment according to Embodiment 1 of the present invention.

As shown in FIG. 1, in-vehicle equipment 1 according to Embodiment 1 includes: an electronic device 2 that operates using an in-vehicle battery 100 as a power supply; a control section 3 that controls the electronic device 2; a first power supply section 4 of a step-down DC/DC converter (buck converter, step-down converter etc.) type that supplies power to the control section 3; a power supply reverse connection protection section 6 that prevents a reverse current that flows in a case where the battery 100 and the electronic device 2 are connected with a reverse polarity; and a second power supply section 7 that generates a drive voltage to drive the power supply reverse connection protection section 6.

In the following, a case where the battery 100 is connected to the in-vehicle equipment 1 with a positive polarity is referred to as normal connection, and a case where the battery 100 is connected to the in-vehicle equipment 1 with the reverse polarity is referred to as reverse connection.

The in-vehicle equipment 1 is, e.g., an ECU (Electronic Control Unit) that is mounted in a vehicle. The control section 3 is, e.g., a CPU (Central Processing Unit), and operates with power supplied from the first power supply section 4. A specific example of the electronic device 2 will be described in Embodiment 4.

The power supply reverse connection protection section 6 includes a semiconductor switch that is connected between the battery 100 and the electronic device 2. In Embodiment 1, an N-channel FET 11 is used as the semiconductor switch. The FET 11 is turned on at the time of normal connection of the battery 100, and is turned off at the time of reverse connection thereof.

In addition, the FET 11 has a parasitic diode D1. A plus terminal of the battery 100 and an anode terminal of the parasitic diode D1 are connected, and a cathode terminal of the parasitic diode D1 and the electronic device 2 are connected. A current flows in a forward direction of the parasitic diode D1 at the time of normal connection of the battery 100, while at the time of reverse connection, the parasitic diode D1 prevents the current flowing in a direction opposite to that at the time of normal connection.

The first power supply section 4 has a step-down DC/DC converter constituted by a switching element (e.g., a P-channel FET 12 having a parasitic diode D2), a primary winding L1 (first coil) of a transformer T1, and a reflux diode D3. The input side of the step-down DC/DC converter is connected to the cathode terminal of the parasitic diode D1 of the FET 11, the control section 3 is connected to the output side of the step-down DC/DC converter, a switching voltage is generated in the primary winding L1 by performing a switching operation of the FET 12 using a step-down control IC 5, and power is supplied to the control section 3.

In Embodiment 1, the transformer T1 is used at a position of the step-down DC/DC converter where a choke coil is used generally. A winding start portion of a secondary winding L2 (second coil) of the transformer T1 and the plus terminal of the battery 100 are connected, and a winding end portion of the secondary winding L2 of the transformer T1 and an anode terminal of a rectifier diode D4 are connected. A cathode terminal of the rectifier diode D4 is connected to a gate terminal of the N-channel FET 11. The second power supply section 7 is constituted by the secondary winding L2 of the transformer T1, the rectifier diode D4, and a smoothing capacitor C1. The second power supply section 7 is a power supply section that generates the drive voltage for driving the FET 11 by using a voltage generated in the primary winding L1 of the transformer T1.

The first purpose of using the N-channel FET as the FET 11 of the power supply reverse connection protection section 6 is to prevent, at the reverse connection of the battery 100, the current flowing in the direction opposite to that at the time of normal connection using the parasitic diode D1 of the FET 11 to thereby prevent a failure of the in-vehicle equipment 2.

The second purpose thereof is to reduce, at the normal connection, power consumption of the N-channel FET 11 by supplying the drive voltage higher than the voltage of the battery 100 to the gate terminal of the FET 11 to thus turn on the FET 11.

Next, a description will be given of a method for supplying the drive voltage higher than the voltage of the battery 100 to the gate terminal of the N-channel FET 11.

Figure 2:
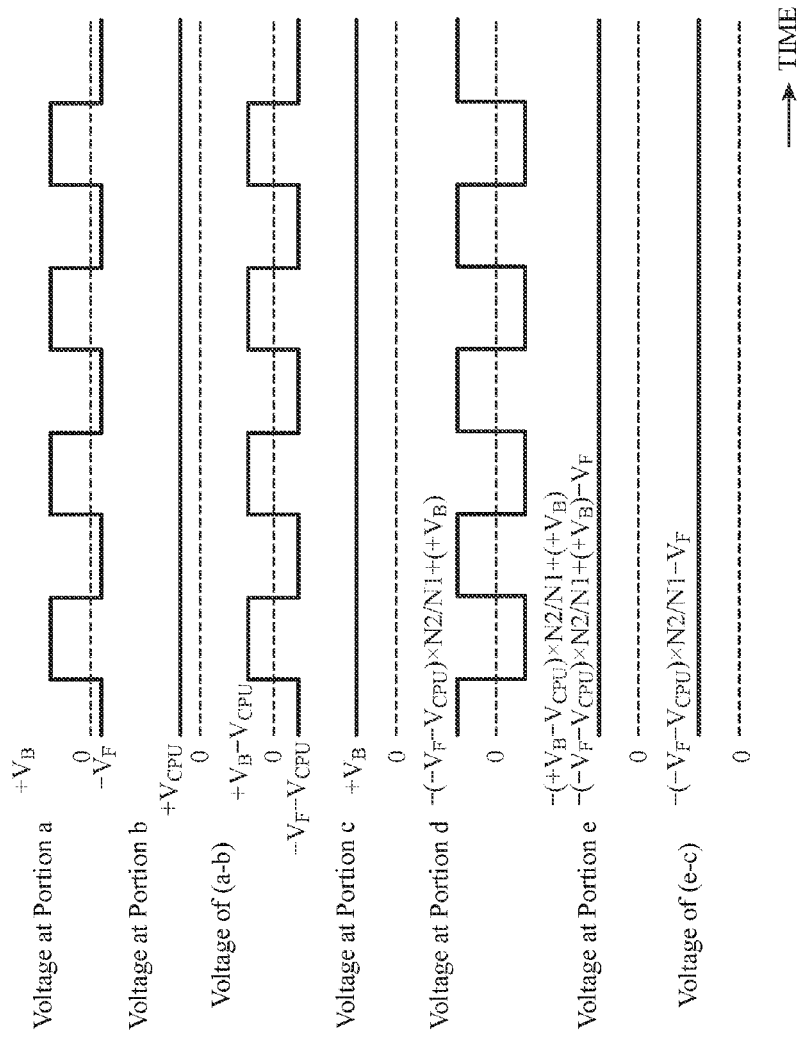
FIG. 2 shows graphs showing operation waveforms of individual portions of the in-vehicle equipment according to Embodiment 1.

FIG. 2 shows graphs showing operation waveforms of individual portions of the in-vehicle equipment 1 according to Embodiment 1, and a horizontal axis of each of the graphs indicates time and a vertical axis thereof indicates voltage. A terminal voltage of a winding start portion of the primary winding L1 of the transformer T1 is represented as a voltage at portion a; a terminal voltage of a winding end portion of the primary winding L1 of the transformer T1 is represented as a voltage at portion b; a voltage applied to the primary winding L1 of the transformer T1 is represented as a voltage of (a-b); a terminal voltage of the winding start portion of the secondary winding L2 of the transformer T1 is represented as a voltage at portion c; a terminal voltage of the winding end portion of the secondary winding L2 of the transformer T1 is represented as a voltage at portion d; the drive voltage applied to the gate terminal of the FET 11 of the power supply reverse connection protection section 6 is represented as a voltage at portion e; and a gate-source voltage of the FET 11 of the power supply reverse connection protection section 6 is represented as a voltage of (e-c).

As shown in FIG. 2, the terminal voltage of the winding start portion (portion a) of the primary winding L1 of the transformer T1 is switched between a voltage $V_B$ of the battery 100 and a forward voltage $V_F$ of the reflux diode D3 in response to ON/OFF of the FET 12. The terminal voltage of the winding end portion (portion b) of the primary winding L1 of the transformer T1 represents a drive voltage $V_{CPU}$ of the control section 3. Consequently, the voltage (a-b) applied to the primary winding L1 of the transformer T1 is switched between a voltage $(=+V_B-V_{CPU})$ obtained by subtracting the drive voltage $V_{CPU}$ of the control section 3 from the voltage $V_B$ of the battery 100 and a voltage $(=-V_F-V_{CPU})$ obtained by subtracting the drive voltage $V_{CPU}$ of the control section 3 from the forward voltage $V_F$ of the reflux diode D3.

As shown in the following Expression (1), to the secondary winding L2 of the transformer T1, a switching voltage $V_{L2}$ obtained by multiplying the switching voltage (a-b) on the primary side of the transformer T1 by a turn ratio of the transformer T1 (=the number of turns N2 of the secondary winding L2/the number of turns N1 of the primary winding L1) is applied.

$$V_{L2} = -(-V_F - V_{CPU}) \times N2/N1,$$

$$-(+V_B - V_{CPU}) \times N2/N1 \qquad (1)$$

When the winding start portion (portion c) of the secondary winding L2 of the transformer T1 is connected to the battery 100, a voltage obtained by further adding the voltage $V_B$ of the battery 100 to the switching voltage $V_{L2}$ to be applied to the secondary side of the transformer T1 is generated in the winding end portion (portion d) of the secondary winding L2.

That is, the maximum value of the switching voltage to be generated in the winding end portion (portion d) of the secondary winding L2 of the transformer T1 has a value to be obtained by adding the voltage $V_B$ of the battery 100 to a value such that a value obtained by adding the drive voltage $V_{CPU}$ of the control section 3 to the forward voltage $V_F$ of the reflux diode D3 is multiplied by the number of turns of the transformer T1.

The maximum voltage generated in the winding end portion (portion d) of the secondary winding L2 of the transformer T1 is smoothed by the rectifier diode D4 and the smoothing capacitor C1 and is applied to the gate terminal of the FET 11 of the power supply reverse connection protection section 6, so that the FET 11 is turned on.

Though details will be described later, since the drive voltage $V_{CPU}$ of the control section 3 and the forward voltage $V_F$ of the reflux diode D3 scarcely fluctuate, even when the voltage $V_B$ of the battery 100 fluctuates, the low side of the switching voltage to be applied to the primary winding L1 of the transformer T1 scarcely fluctuates; consequently, the high side of the switching voltage to be generated in the winding end portion (portion d) of the secondary winding L2 scarcely fluctuates. In addition, the switching voltage to be generated in the winding end portion (portion d) of the secondary winding L2 can be freely set by the number of turns of the transformer T1. Therefore, the winding end portion (portion d) of the secondary winding L2 is connected to the gate terminal of the FET 11 of the power supply reverse connection protection section 6.

Next, withstand voltage between the gate and the source of the FET 11 to be used in the power supply reverse connection protection section 6 will be examined.

For example, the following are assumed: the voltage $V_B$ of the battery 100 is 12 V; the drive voltage $V_{CPU}$ of the control section 3 is 5 V; the number of turns N1 of the primary winding L1 of the transformer T1 is 10 turns; and the forward voltage $V_F$ of the reflux diode D3 is 0.7 V. Here, in a case where it is desired to set the drive voltage of the FET 11 to 10 V, when the number of turns N2 of the secondary winding L2 of the transformer T1 is set to 20 turns, the gate-source voltage $V_{GS}$ of the FET 11 is 10.7 V from Expression (2), so that it is possible to generate the desired drive voltage.

$$V_{GS} = -(-V_F - V_{CPU}) \times N2/N1 - V_F \qquad (2)$$
$$= 10.7 \text{ V}$$

As important parameters for determining the drive voltage of the FET11, the turn ratio N2/N1 of the transformer T1 and the drive voltage $V_{CPU}$ of the control section 3 are dominant.

On the other hand, variations in the number of turns of the transformer T1 do not exist and it is general to design the drive voltage $V_{CPU}$ with high accuracy even when influences of an input voltage and an ambient temperature are taken into account, and hence, in the accuracy of the drive voltage of the FET 11, the influence of the forward voltage $V_F$ of the reflux diode D3 is dominant.

Here, in order to determine the withstand voltage between gate and source of the FET 11, the maximum value of the voltage $V_{GS}$ applied between the gate and the source will be calculated.

For example, the following are assumed: the voltage $V_B$ of the battery 100 is 12 V; the drive voltage $V_{CPU}$ of the control section 3 is 5 V; the number of turns N1 of the primary winding L1 of the transformer T1 is 10 turns; the number of turns N2 of the secondary winding L2 is 20 turns; the ambient temperature is −40° C.; the forward voltage $V_F$ of the reflux diode D3 is 0.7 V in a room temperature environment (25° C.); and a temperature change rate is −2.2 mV/° C. In this case, in the room temperature environment of 25° C., as in the calculation in Expression (2) described above, the voltage $V_{GS}$ is 10.70 V. In contrast, in the environment of −40° C., the forward voltage $V_F$ of the reflux diode D3 is 0.84 V from Expression (3), and hence the voltage $V_{GS}$ is 10.98 V.

$$V_F = \text{(room temperature−ambient temperature)} \times \text{temperature change rate} + 0.7$$
$$= 0.84 \text{ V} \qquad (3)$$

With respect to the temperature change from 25 degrees to −40 degrees Celsius, a fluctuation rate of the gate-source voltage $V_{GS}$ is about 0.3 V, which is adequate as the accuracy of the voltage to be applied between the gate and the source.

From the above calculation result, a 20 V product is selected with respect to the withstand voltage between gate and source of the FET 11 to be used in the power supply reverse connection protection section 6.

In Embodiment 1, the transformer T1 is used at the position of the step-down DC/DC converter of the first power supply section 4 where the choke coil is generally used. The primary winding L1 of the transformer T1 is used as a voltage conversion element of the step-down DC/DC converter through the use of its coil performance, and the drive voltage $V_{CPU}$ of the control section 3 is thereby generated. On the other hand, the secondary winding L2 of the transformer T1 generates the voltage such that the voltage of the primary winding L1 is multiplied by the number of turns of the transformer T1 to be thus higher than the voltage $V_B$ of the battery 100; when the resultant voltage is smoothed, the drive voltage of the FET 11 of the power supply reverse connection protection section 6 is generated. The drive voltage of the FET 11 can be generated by three components of the transformer T1, the rectifier diode D4, and the smoothing capacitor C1, and hence it is possible to achieve an inexpensive power supply reverse connection protection function with a simple configuration.

In addition, since current consumption of the N-channel FET 11 to be used in the power supply reverse connection protection section 6 is extremely low, power loss to be applied to the secondary winding L2 of the transformer T1 can be nearly ignored when compared with that of the primary winding L1. Therefore, the size of a core used in the transformer T1 may be equal to that of the core in a case where the choke coil is used. In addition, it is not necessary to increase the diameter of the primary winding L1. Thus, an increase in size of the component and an increase in cost due to replacement of the choke coil with the transformer T1 are small, and it is thus possible to achieve the power supply reverse connection protection function with a small component area.

Consequently, as compared with a power supply reverse connection protection circuit in which the conventional charge pump-type booster circuit is used, Embodiment 1 can reduce the number of components and simplify the configuration in addition to achievement of an equivalent function thereto, and hence it is possible to achieve reductions in size and cost of the in-vehicle equipment 1.

Further, since it is configured that power is supplied from a drain terminal of the FET 11 of the power supply reverse connection protection section 6 to the step-down DC/DC converter of the first power supply section 4, it is possible to prevent the flow of the reverse current to the battery 100 at the time of reverse connection of the battery 100.

On the other hand, in a case where the step-down DC/DC converter is connected to the battery 100 (not shown), there is a possibility that a failure of the in-vehicle equipment 2 occurs due to the flow of the reverse current to the battery 100 via the reflux diode D3 and the parasitic diode D2 of the FET 12 at the time of reverse connection of the battery 100.

With the foregoing, according to Embodiment 1, the in-vehicle equipment 1 has: the electronic device 2 that operates using the battery 100 as the power supply; the first power supply section 4 having the step-down DC/DC converter that reduces the voltage of the battery 100; the control section 3 that operates using the first power supply section 4 as the power supply to control the electronic device 2; and the FET 11 connected between the battery 100 and the electronic device 2, and it is configured to further include: the power supply reverse connection protection section 6 in which the forward direction of the parasitic diode D1 of the FET 11 is brought to the direction the current flows at the time of normal connection of the battery 100, and in which at the time of reverse connection of the battery 100, the FET 11 is turned off and the parasitic diode D1 prevents the current that flows in the direction opposite to that at the time of normal connection; and the second power supply section 7 that generates the drive voltage to turn on the FET 11 of the power supply reverse connection protection section 6 at the time of normal connection by using the voltage generated in the step-down DC/DC converter of the first power supply section 4. Since the second power supply section 7 can be constituted by three components of the secondary winding L2 of the transformer T1, the rectifier diode D4, and the smoothing capacitor C1, it is possible to achieve the inexpensive power supply reverse connection protection section 6 with the simple configuration. Consequently, as compared with the case where the drive voltage of the FET is generated by using the charge pump-type booster circuit, it is possible to achieve reductions in size and in cost of the in-vehicle equipment 1.

Embodiment 2

Figure 3:
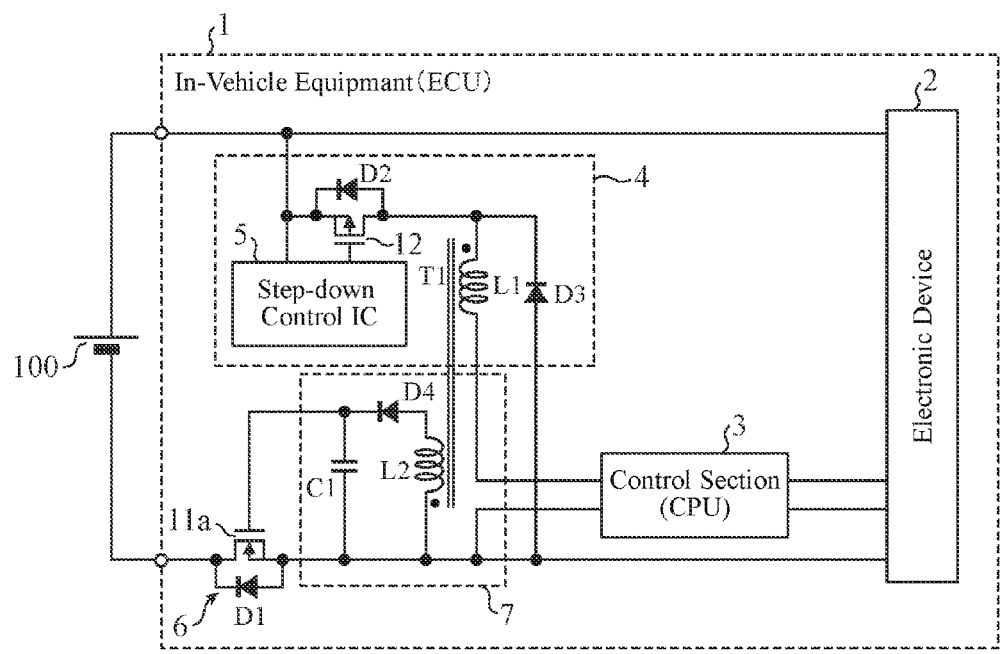
FIG. 3 is a circuit diagram showing a configuration of in-vehicle equipment according to Embodiment 2 of the invention.

FIG. 3 is a circuit diagram showing a configuration of in-vehicle equipment 1 according to Embodiment 2. Parts in FIG. 3 identical or equivalent to those in FIG. 1 are denoted by the same reference numerals, and descriptions thereof will be omitted.

In Embodiment 2, an N-channel FET 11a of the power supply reverse connection protection section 6 is arranged on the minus terminal side of the battery 100.

In the case where the N-channel FET 11 is connected to the plus terminal side of the battery 100 (FIG. 1), the anode terminal of the parasitic diode D1 is connected to the battery 100 and the cathode terminal thereof is connected to the electronic device 2, while in the case where the N-channel FET 11a is connected to the minus terminal side (FIG. 3), the anode terminal of the parasitic diode D1 is connected to the electronic device 2, and the cathode terminal thereof is connected to the minus terminal of the battery 100. In addition, the winding end portion of the primary winding L1 of the transformer T1 is connected to the control section 3, and the winding start portion of the secondary winding L2 is connected to the battery 100.

In the configuration of Embodiment 2, the same effects as those in Embodiment 1 described above are also obtained. In addition, since the voltage of the primary winding L1 of the transformer T1 and the voltage of the secondary winding L2 thereof are insulated, the N-channel FET 11a can be easily arranged on the minus terminal side of the battery 100.

Embodiment 3

Figure 4:
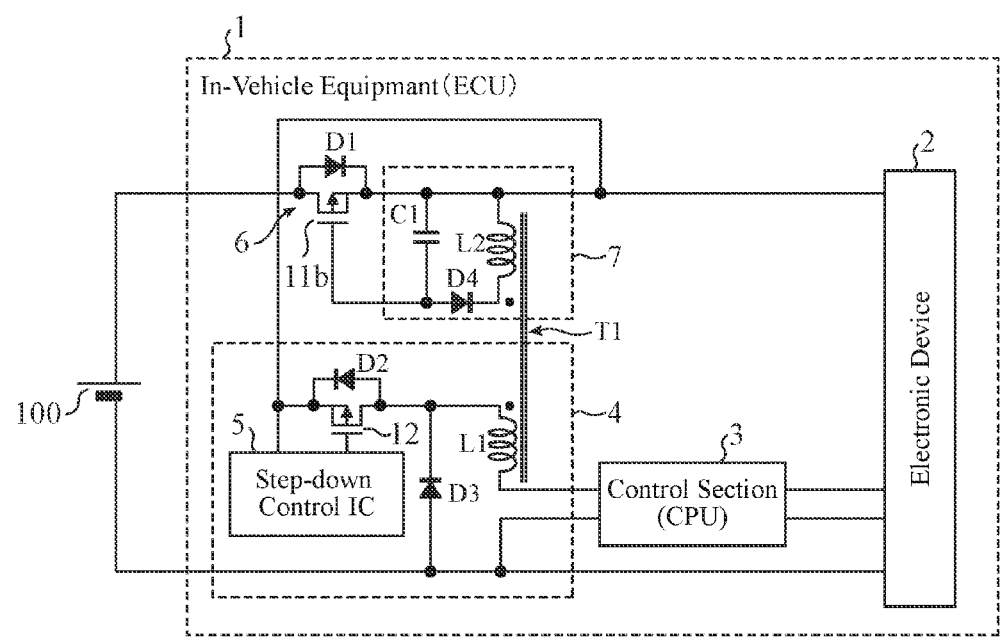
FIG. 4 is a circuit diagram showing a configuration of in-vehicle equipment according to Embodiment 3 of the invention.

FIG. 4 is a circuit diagram showing a configuration of in-vehicle equipment 1 according to Embodiment 3. Parts in FIG. 4 identical or equivalent to those in FIG. 1 are denoted by the same reference numerals, and descriptions thereof will be omitted.

In Embodiment 3, a P-channel FET 11b is used as the semiconductor switch of the power supply reverse connection protection section 6.

In the case where the N-channel FET 11 is used (FIG. 1), the winding start portion of the secondary winding L2 of the transformer T1 is connected to the battery 100 and the winding end portion of the secondary winding L2 is connected to the rectifier diode D4, while in a case where the P-channel FET 11b is used (FIG. 4), the winding direction of the secondary winding L2 of the transformer T1 is reversed, the winding end portion of the secondary winding L2 is connected to the battery 100, and the winding start portion of the secondary winding L2 is connected to the rectifier diode D4. In addition, the winding start portion of the primary winding L1 of the transformer T1 is connected to the control section 3.

In the configuration of Embodiment 3, the same effects as those in Embodiment 1 described above are also obtained. In addition, it is possible to easily give the drive voltage of a negative potential to a gate terminal of the P-channel FET 11*b* when the winding direction of the secondary winding L2 of the transformer T1 is just reversed.

Embodiment 4

Figure 5:
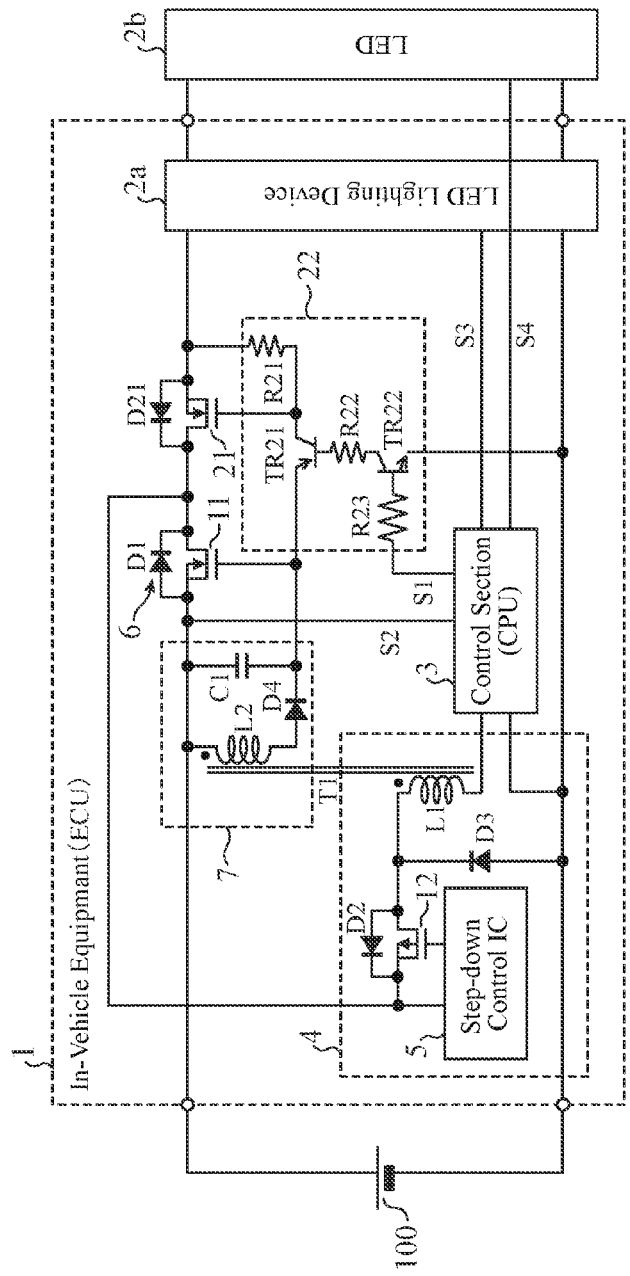
FIG. 5 is a circuit diagram showing a configuration of in-vehicle equipment according to Embodiment 4 of the invention.

FIG. 5 is a circuit diagram showing a configuration of in-vehicle equipment 1 according to Embodiment 4. Parts in FIG. 5 identical or equivalent to those in FIG. 1 are denoted by the same reference numerals, and descriptions thereof will be omitted.

In Embodiment 4, a semiconductor switch for switching between supply and interruption of power to the electronic device from the battery 100 is added to the in-vehicle equipment 1 of each of Embodiments 1 to 3 described above. As the semiconductor switch, similarly to the case of the FET 11 of the power supply reverse connection protection section 6, an N-channel FET 21 having a parasitic diode D21 is used. As the drive voltage for driving the FET 21, similarly to the case of the FET 11 of the power supply reverse connection protection section 6, the voltage generated by the second power supply section 7 is used.

In addition, in Embodiment 4, as the electronic device 2 (FIG. 1) to which power of the battery 100 is supplied, an LED (light-emitting diode) lighting device 2*a* and an LED 2*b* are exemplified. The LED lighting device 2*a* operates using the battery 100 as the power supply to light the LED 2*b*.

A signal transmission section 22 is a circuit that transmits the drive voltage generated by the second power supply section 7 to the FET 21, and the signal transmission section 22 operates in response to an ON/OFF switching signal S1 outputted by the control section 3 and the FET 21 is thereby switched between ON and OFF. In the signal transmission section 22, an emitter terminal of a transistor TR21 is connected to the second power supply section 7, a collector terminal thereof is connected to a resistor R21, and a base terminal thereof is connected to a collector terminal of a transistor TR22 via a resistor R22. An emitter terminal of the transistor TR22 is connected to the minus terminal side of the battery 100, and a base terminal thereof is connected to the control section 3 via a resistor R23.

When an ON/OFF switching signal S1 of a high level is outputted to the transistor TR22 from the control section 3, the transistor TR22 is turned on, and the transistor TR21 is thereby turned on. As a result, the drive voltage is applied to the FET 21 from the second power supply section 7, the FET 21 is turned on, and power is supplied to the LED lighting device 2*a*. On the other hand, when the ON/OFF switching signal S1 of a low level is outputted to the transistor TR22 from the control section 3, the transistor TR22 and the transistor TR21 are turned off, so that the FET 21 is turned off and the power supply to the LED lighting device 2*a* is interrupted. In a case where the control section 3 switches the ON/OFF switching signal S1 from the high level to the low level in a state where power is supplied to the LED lighting device 2*a* from the battery 100, the FET 21 is immediately stopped. Conversely, it is also possible to activate the FET 21 immediately.

The control section 3 acquires the voltage inputted from the battery 100 as an input voltage signal S2 to monitor the input voltage. In addition, the control section 3 acquires a state signal S3 indicative of whether the LED lighting device 2*a* is normal or abnormal to monitor the LED lighting device 2*a*. Further, the control section 3 acquires a state signal S4 indicative of whether the LED 2*b* is normal or abnormal to monitor the LED 2*b*. In a case where the control section 3 monitors a plurality of signals, on detecting that at least one of the input voltage signal S2, the state signal S3, and the state signal S4 has a value indicative of an abnormality, the control section outputs the high-level ON/OFF switching signal S1 to turn off the FET 21, to thereby interrupt the power supply to the LED lighting device 2*a* from the battery 100.

With the foregoing, according to Embodiment 4, the in-vehicle equipment 1 includes the FET 21 that switches between energization and interruption to the LED lighting device 2*a* from the battery 100 between the FET 11 of the power supply reverse connection protection section 6 and the LED lighting device 2*a* (electronic device), and it is configured that the FET 21 operates with the drive voltage generated by the second power supply section 7. Therefore, it becomes possible to switch between supply and stop of the power supply in accordance with a situation, and functionality is improved. In addition, in the case where the control section 3 detects the abnormality of the battery 100, the LED lighting device 2*a*, or the LED 2*b* or the like, the control section 3 can operate the FET 21 to stop the power supply, and hence it is possible to prevent a chain of failures after a certain function failure.

Note that though in the illustrated example, the FET 21 is connected between the FET 11 of the power supply reverse connection protection section 6 and the LED lighting device 2*a*, the FET 21 may also be connected between the battery 100 and the FET 11 of the power supply reverse connection protection section 6.

Embodiment 5

Figure 6:
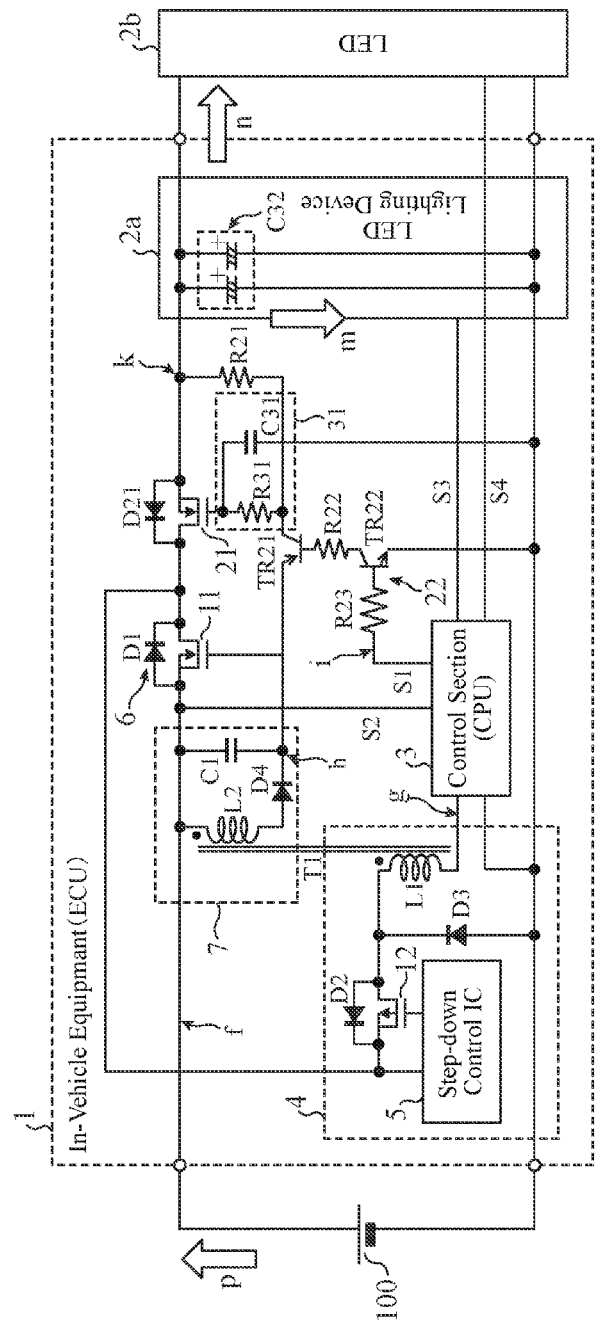
FIG. 6 is a circuit diagram showing a configuration of in-vehicle equipment according to Embodiment 5 of the invention.

FIG. 6 is a circuit diagram showing a configuration of in-vehicle equipment 1 according to Embodiment 5. Parts in FIG. 6 identical or equivalent to those in FIG. 5 are denoted by the same reference numerals, and descriptions thereof will be omitted.

In Embodiment 5, an integrator 31 is added to the signal transmission section 22 in Embodiment 4 described above to thereby suppress an input inrush current on activation. The integrator 31 is constituted by, e.g., a resistor R31 and a capacitor C31, and is connected to a gate terminal of the FET 21 for the semiconductor switch that switches between the supply and the interruption of power to the LED lighting device 2*a* from the battery 100.

Figure 7:
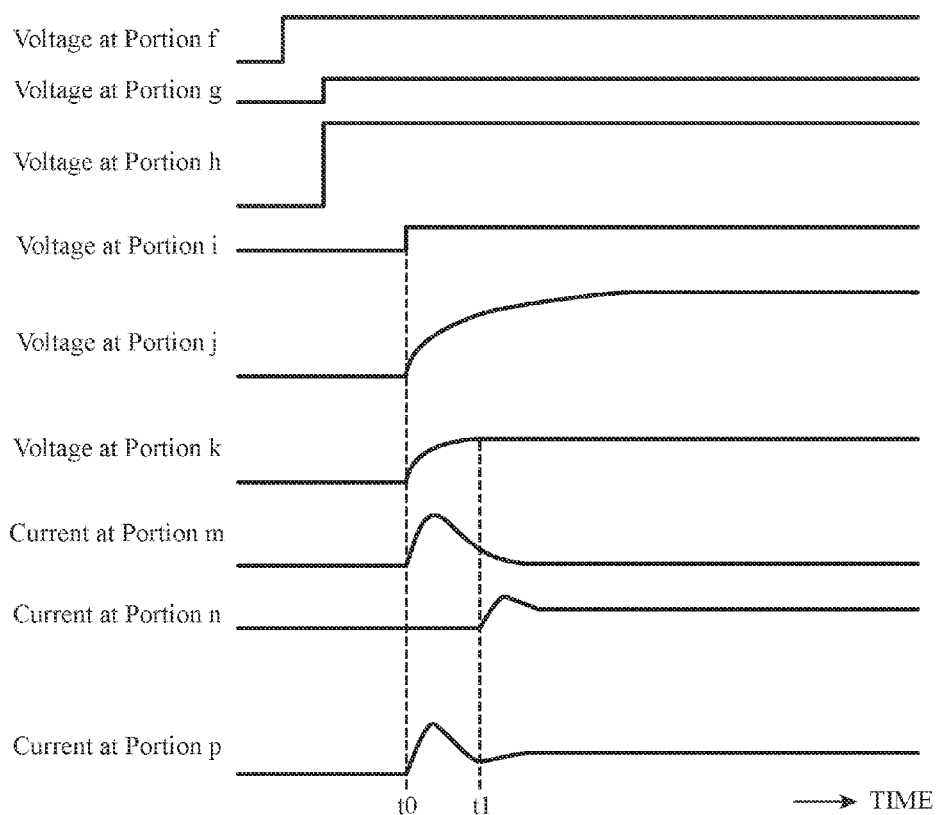
FIG. 7 shows graphs showing operation waveforms of individual portions of the in-vehicle equipment according to Embodiment 5.

FIG. 7 shows graphs showing operation waveforms of individual portions of the in-vehicle equipment 1 according to Embodiment 5, and a horizontal axis of the graph indicates time and a vertical axis thereof indicates voltage or current. The voltage of the battery 100 is represented as a voltage at portion f; the drive voltage of the control section 3 is represented as a voltage at portion g; the drive voltage of each of the FET 11 and the FET 21 is represented as a voltage at portion h; the ON/OFF switching signal (high active) of the FET 21 outputted by the control section 3 is represented as a voltage at portion i; the voltage of the gate terminal of the FET 21 is represented as a voltage at portion j; the voltage of a source terminal of the FET 21 is represented as a voltage at portion k; a current of a large-capacity capacitor C32 on the input side of the LED lighting device 2*a* is represented as a current at portion m; a current flowing to the LED 2*b* is represented as a current at portion n; and a current of the battery 100 is represented as a current at portion p.

When the gate terminal of the N-channel FET 21 for the semiconductor switch is controlled to have an integral-type rise (portion j in FIG. 7), the source terminal thereof also has the integral-type rise similarly (portion k in FIG. 7). A characteristic of an integral-type waveform is that a voltage change per time (dV/dt) is large at a timing of start of activation (time t0 in FIG. 7), dV/dt is reduced as time elapses, and dV/dt approaches zero at a timing of reaching the vicinity of a desired voltage (time t1 in FIG. 7).

In a case where the integral-type rise voltage is applied to the source terminal of the N-channel FET 21 for the semiconductor switch, in other words, as a voltage across the large-capacity capacitor C32 of the LED lighting device 2a, according to basic Expression (4) of the capacitor, a relatively large current flows to the large-capacity capacitor C32 at the timing of start of the activation (time t0 in FIG. 7) at which dV/dt is large, but dV/dt approaches zero without limit at the timing of reaching the vicinity of the desired voltage (time t1 in FIG. 7), in other words, it is in a state where charging of the large-capacity capacitor C32 is completed (portion m in FIG. 7).

$$i(t)=C\times dV(t)/dt \tag{4}$$

The LED 2b is activated by the LED lighting device 2a in the state in which the charging of the large-capacity capacitor C32 is completed (time t1 in FIG. 7), whereby a stable rise of the current of the LED 2b is allowed (portion n in FIG. 7).

If the FET 21 is turned on under the condition in which a current limitation function by the integrator 31 is not provided, the voltage of the LED lighting device 2a sharply rises to the voltage level of the battery 100, so that a large current is supplied to the large-capacity capacitor C32 from the battery 100. On this occasion, the voltage of a power supply terminal (not shown) of the LED lighting device 2a is sharply reduced with an input impedance between the battery 100 and the LED lighting device 2a; thus, when the LED 2b is activated in such a situation, there is a possibility that the activation and stop of the LED 2b are repeated.

With the foregoing, according to Embodiment 5, the in-vehicle equipment 1 includes the signal transmission section 22 that transmits the drive voltage generated by the second power supply section 7 to the FET 21 for the semiconductor switch, and the signal transmission section 22 has the integrator 31 that slows down the switching operation of the FET 21. Accordingly, it is possible to suppress the input inrush current on activation.

Embodiment 6

Figure 8:
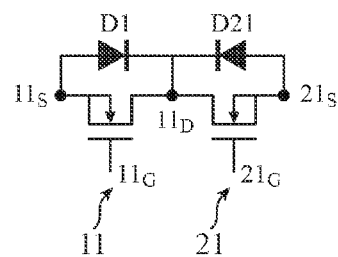
FIG. 8 is a circuit diagram in which two FETs of in-vehicle equipment according to Embodiment 6 of the invention are integrated.
Figure 9:
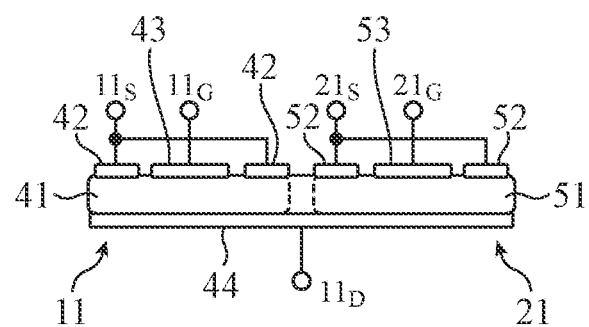
FIG. 9 is a schematic view showing a configuration of the in-vehicle equipment according to Embodiment 6 in which two FETs are integrated.

FIG. 8 is a circuit diagram in which the FET 11 and the FET 21 of in-vehicle equipment 1 according to Embodiment 6 are integrated. FIG. 9 is a schematic view showing a configuration in which the FET 11 and FET 21 are integrated. The other circuit configuration of the in-vehicle equipment 1 is the same as that described in Embodiments 1 to 5 described above, and hence descriptions thereof will be omitted.

In Embodiment 6, the FET 11 of the power supply reverse connection protection section 6 and the FET 21 for the semiconductor switch that switches between energization and interruption to the electronic device 2 from the battery 100 are integrally configured. As shown in FIG. 9, on one surface of a semiconductor layer 41 of the FET 11, a source electrode 42 to which a source terminal $11_S$ is connected and a gate electrode 43 to which a gate terminal $11_G$ is connected are formed. Similarly, on one surface of a semiconductor layer 51 of the FET 21, a source electrode 52 to which a source terminal $21_S$ is connected and a gate electrode 53 to which a gate terminal $21_G$ is connected are formed. On the opposite surfaces of the semiconductor layers 41 and 51, a drain electrode 44 common to the FETs 11 and 21 is formed, and a drain terminal $11_D$ common to the FETs 11 and 21 is connected to the drain electrode 44.

When the two FETs 11 and 21 are integrated into one package by commonality of the drain terminals thereof, it becomes possible to reduce the number of components and the size.

Note that, in the present invention, it is possible to freely combine the embodiments, modify any components of the embodiments, or omit any components in the embodiments within the scope of the invention.

INDUSTRIAL APPLICABILITY

Thus, in the in-vehicle equipment according to the present invention, it is configured that the voltage that drives the FET of the power supply reverse connection protection circuit is generated by using the DC/DC converter that supplies power to the CPU, and hence it is possible to achieve reductions in size and cost thereof, and the in-vehicle equipment is suitably used as in-vehicle equipment that controls a lighting device of a vehicle-mounted light source (headlamp or the like) or the like.

DESCRIPTION OF REFERENCE NUMERALS AND SIGNS

1: in-vehicle equipment
2: electronic device
3: control section
4: first power supply section
5: step-down control IC
6: power supply reverse connection protection section
7: second power supply section
11, 11a, 11b, 12, 21: FET
$11_G$, $21_G$: gate terminal
$11_S$, $21_S$: source terminal
$11_D$: drain terminal
22: signal transmission section
31: integrator
41, 51: semiconductor layer
42, 52: source electrode
43, 53: gate electrode
44: drain electrode
100: battery
C1: smoothing capacitor
C31, C32: capacitor
D1, D2, D21: parasitic diode
D3: reflux diode
D4: rectifier diode
L1: primary winding
L2: secondary winding
T1: transformer
TR21, TR22: transistor
R21 to R23, R31: resistor
S1: ON/OFF switching signal
S2: input voltage signal
S3, S4: state signal

The invention claimed is:
1. In-vehicle equipment comprising:
an electronic device that operates using an in-vehicle battery as a power supply;
a first power supply that has a step-down DC/DC converter to reduce a voltage of the battery;
a controller that operates using the first power supply as a power supply to control the electronic device;

a power supply reverse connection protector that has a FET connected between the battery and the electronic device, wherein the FET is connected such that a forward direction of a parasitic diode of the FET matches a direction in which a current flows at a time of normal connection at which the battery and the electronic device are connected with a positive polarity, and that at a time of reverse connection at which the battery and the electronic device are connected with a reverse polarity, the FET is turned off and the parasitic diode prevents a current flowing in a direction opposite to that at the time of the normal connection; and a second power supply that generates a drive voltage to turn on the FET of the power supply reverse connection protector at the time of the normal connection by using a voltage generated in the step-down DC/DC converter of the first power supply.

2. The in-vehicle equipment according to claim 1, wherein the second power supply has a second coil added to a first coil constituting the step-down DC/DC converter of the first power supply, and outputs a voltage generated in the second coil to the FET of the power supply reverse connection protector as the drive voltage.

3. The in-vehicle equipment according to claim 1, further comprising a semiconductor switch that switches between energization and interruption to the electronic device from the battery, between the FET of the power supply reverse connection protector and the electronic device or between the battery and the FET of the power supply reverse connection protector, wherein the semiconductor switch operates with the drive voltage generated by the second power supply.

4. The in-vehicle equipment according to claim 3, further comprising a signal transmitter that transmits the drive voltage generated by the second power supply to the semiconductor switch, wherein the signal transmitter has an integrator that slows down a switching operation of the semiconductor switch.

5. The in-vehicle equipment according to claim 3, wherein the FET of the power supply reverse connection protector and the semiconductor switch that switches between energization and interruption to the electronic device from the battery are integrally configured.

6. The in-vehicle equipment according to claim 1, wherein the electronic device is constituted by an LED and an LED lighting device that lights the LED.

* * * * *